United States Patent [19]

Botez et al.

[11] Patent Number: 5,050,180
[45] Date of Patent: Sep. 17, 1991

[54] PHASE-LOCKED ARRAYS OF COUPLED X-JUNCTIONS

[75] Inventors: Dan Botez, Redondo Beach; Luke J. Mawst, Torrance, both of Calif.

[73] Assignee: TRW Inc., Redondo Beach, Calif.

[21] Appl. No.: 419,289

[22] Filed: Oct. 10, 1989

[51] Int. Cl.⁵ .............................................. H01S 3/19
[52] U.S. Cl. ...................................... 372/45; 372/18; 372/19; 372/50; 385/39; 385/15; 385/130
[58] Field of Search .................. 372/50, 45, 46, 48, 372/18, 19; 350/96.13, 96.15, 96.12

[56] References Cited

U.S. PATENT DOCUMENTS

| Re. 31,806 | 1/1985 | Scifres et al. | 372/50 |
|---|---|---|---|
| 4,719,634 | 1/1988 | Streifer et al. | 372/46 |
| 4,752,932 | 6/1988 | Matsumoto et al. | 372/45 |
| 4,764,937 | 8/1988 | Matsumoto et al. | 372/50 |
| 4,772,082 | 9/1988 | Matsui et al. | 350/96.12 |
| 4,799,225 | 1/1989 | Taneya et al. | 372/44 |
| 4,805,176 | 2/1989 | Botez et al. | 372/29 |
| 4,809,288 | 2/1989 | Welch et al. | 372/46 |
| 4,815,088 | 3/1989 | Matsumoto et al. | 372/46 |
| 4,850,666 | 7/1989 | Izutsu et al. | 350/96.12 |
| 4,852,113 | 7/1989 | Botez | 372/50 |
| 4,859,014 | 8/1989 | Schmitt et al. | 350/96.13 |
| 4,860,298 | 8/1989 | Botez et al. | 372/45 |
| 4,866,724 | 9/1989 | Botez et al. | 372/50 |

OTHER PUBLICATIONS

Botez et al., IEEE Cir & Dev., vol. 2(1), (1986), pp. 8-17, "Phase-Locked Arrays of Semiconductor Diode Lasers".
Heidel et al., IEEE J. Quant. Electron., vol. QE-22, (1986), "Use of a Phase Corrector Plate to Generate a . . .", pp. 749-753.
D. Botez et al., "Diffraction-Limited-Beam, High-Power Operation from X-Junction Coupled Phase-Locked Arrays of AlGaAs/GaAs Diode Lasers", Appl. Phys. Lett. 53(15), pp. 1366-1368, 10 Oct. 1988.

Primary Examiner—William L. Sikes
Assistant Examiner—Galen J. Hansen
Attorney, Agent, or Firm—Noel F. Heal; Sol L. Goldstein

[57] ABSTRACT

An array of semiconductor laser diodes having parallel waveguide elements, of which each adjacent pair is coupled together by an X-shaped waveguide junction having a connecting waveguide in which lateral modes are formed as a result of merging of the pair of waveguide elements. The waveguide elements diverge again from the connecting waveguide at an angle great enough to ensure that there are high scattering and radiation losses near the point of divergence of the waveguide elements, for the fundamental mode in the connecting waveguide. If an adjacent pair of waveguide elements operate in phase, this excites the fundamental mode in the connecting waveguide, which is effectively suppressed by the losses that occur near the point of divergence from the connecting waveguide. The structure thereby discriminates against connecting waveguide in an in-phase mode, resulting in operation in the 180°-phase-shift array mode, and the production of a diffraction-limited beam at high drive currents and output powers.

20 Claims, 3 Drawing Sheets

PHASE-LOCKED ARRAYS OF COUPLED X-JUNCTIONS

BACKGROUND OF THE INVENTION

This invention relates generally to semiconductor diode lasers and, more particularly, to one-dimensional arrays of semiconductor diode lasers fabricated as single structures. Single-element diode lasers are limited in power to outputs of the order of 30 milliwatts (mW), but arrays of diode lasers can be designed to provide output powers of hundreds of milliwatts. Such high power outputs are useful in optical communications systems, laser printers and other applications.

A survey of the state of the art of phase-locked laser arrays can be found in a paper entitled "Phase-Locked Arrays of Semiconductor Diode Lasers," by Dan Botez and Donald Ackley, IEEE Circuits and Devices Magazine, Vol 2, No. 1, pp. 8-17, Jan. 1986.

By way of general background, a semiconductor diode laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer usually have a lower index of refraction than the active layer, and function as cladding layers in a dielectric waveguide that confines the light in a direction perpendicular to the layers. Various techniques are usually employed to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. Because of a requirement for a diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer. Most semiconductor structures employed for lateral index guiding in laser arrays are known as positive-index guides, i.e. the refractive index is highest in regions aligned with the laser elements and falls to a lower value in regions between elements, thereby effectively trapping light within the laser elements.

In general, an array of laser emitters can oscillate in one or more of multiple possible configurations, known as array modes. In what is usually considered to be the most desirable array mode, all of the emitters oscillate in phase. This is known as the fundamental or 0°-phase-shift array mode, and it produces a far-field pattern in which most of the energy is concentrated in a single lobe, the width of which is limited, ideally, only by the diffraction of light. When adjacent laser emitters are 180° out of phase, the array operates in the 180°-phase-shift array mode, and produces two relatively widely spaced lobes in the far-field distribution pattern. Multiple additional modes exist between these two extremes, depending on the phase alignment of the separate emitters, and in general there are N possible array modes for an N-element array. For a ten-element array, the 0°-phase-shift array mode is known as mode $L=1$, and the 180°-phase-shift array mode is known as $L=10$. Many laser arrays operate in two or three array modes simultaneously and produce one or more beams that are typically two or three times wider than the diffraction limit.

One way to increase the power output of a laser array is to operate it at high current drive levels well above the lasing threshold. However, when evanescently-coupled devices that operate in the fundamental array mode at threshold level are driven in excess of 50% above threshold, their beams broaden, as a result of an effect known as gain spatial hole burning, and stable array-mode operation simply cannot be achieved. By providing for strong optical-mode confinement, using positive-index guiding for the elements, gain spatial hole burning is effectively suppressed, but so is the evanescent coupling between elements. One solution to this difficulty is to provide interelement coupling via Y-shaped branches. However, Y-branch coupling is relatively weak and results in emitted beams that are as much as four times larger than the diffraction limit.

Another solution was described, using wide-waveguide interferometric arrays, in application Ser. No. 07/233,390, filed Aug., 1988 by Dan Botez et al., issued as U.S. Pat. No. 4,866,724 entitled "Wide-Waveguide Interferometric Array with Interelement Losses.". This structure was deliberately designed to operate at a higher order array mode ($L=8$ for a 10-element array), which is stable against gain spatial hole burning, but has four lobes in its farfield pattern. The presence of four lobes may adversely affect the efficiency of beam transformation to a single lobe using $\pi$ phase shifters.

U.S. Pat. No. 4,860,298 to Dan Botez et al., entitled "Phase-Locked Array of Semiconductor Lasers Using Closely Spaced Antiguides," discloses another solution to the problem of gain spatial hole burning. In particular, lateral antiguiding provides both strong mode confinement and strong interelement coupling. The device operates at higher powers without being affected by gain spatial hole burning and with a desirable far-field distribution pattern. If powers in excess of 300 mW and up to 1 watt are desired for a particular application, this lateral antiguiding approach probably provides the best solution. However, the complexity of fabrication of the antiguiding structure results in a relatively costly device. Therefore, power outputs in the 200-300 mW range there is clearly a need for a simpler semiconductor laser array structure that will produce a practically diffraction-limited beam. The present invention fulfills this need.

SUMMARY OF THE INVENTION

The present invention resides in a semiconductor laser array structure that can be operated at large drive currents and in the 180°-phase-shift array mode. Since gain spatial hole burning is not a limiting factor when operating in higher-order array modes, a desirable mode of operation is one that favors higher-order modes but at the same time selects a single mode for stable operation and a desirable far-field radiation pattern. An array of straight waveguide elements with interelement losses favors the 180°-phaseshift array mode, but also operates in other higher-order modes simultaneously. Consequently, such a device produces a beam with lobes that are several times wider than the diffraction limit.

The structure of the present invention includes means for producing lasing action in a semiconductor structure, including a substrate, an active semiconductor layer, electrodes for applying a voltage across the active layer, and a pair of reflective facets, at least one of which is an emitting facet, located at opposite ends of the array structure; and an array of waveguides with generally parallel longitudinal axes. The waveguides have a first set of parallel elements extending from one end of the structure to an intermediate region, and a second set of parallel elements aligned with the first set and extending from the intermediate region to the other end of the structure, wherein adjacent pairs of the waveguides are coupled together by an array of X-shaped junctions located in the intermediate region and configured to discriminate against in-phase array mode operation, whereby the laser array structure operates in the 180°-phase-shift array mode and produces a diffraction-limited beam at high output powers, and drive currents substantially above threshold.

Each X-shaped junction includes a pair of converging waveguide sections coupled one to each of a pair of the first set of parallel waveguide elements, a connecting waveguide into which the converging waveguide sections are coupled, and a pair of diverging waveguide sections coupled to the connecting waveguide and to an aligned pair of the second set of parallel waveguide elements. The diverging and converging waveguide sections diverge and converge at an angle sufficiently large to provide radiation and scattering losses in branching regions between the diverging waveguide elements when the fundamental mode is excited in the connecting waveguide. As presently preferred the divergence/convergence angle is greater than approximately three degrees and may be, for example, be six degrees.

It is also preferred that the connecting waveguide be wide enough to support at least two lateral modes, and long enough to allow a single lateral mode to become established. In the disclosed embodiment, the connecting guide is approximately one-and-one-half to two times the width of each waveguide element.

In an alternate form of the X-junction structure, the diverging and converging waveguide sections have branching regions that present a flat surface toward the interconnecting region, to produce radiation and scattering losses for the fundamental mode of the connecting waveguide. With the presence of a such a flat surface, the angle between the diverging and converging waveguide sections does not need to be as large and may be, for example, three degrees.

In another preferred form of the invention, the structure also includes selective phase-shifting means positioned at the emitting facet to correct the phase of selected elemental outputs.

The structure of the invention may be implemented using a variety of specific techniques, such as by a liquid-phase epitaxy (LPE) process, or by a metal-organic chemical vapor deposition (MOCVD) process.

As will be appreciated from this summary, the present invention enables the manufacture of a variety of high-power laser devices having diffraction-limited beams and relatively high output powers. Other aspects and advantages of the invention will become apparent from the following more detailed description, taken in conjunction with the accompanying drawings.

DESCRIPTION OF THE PREFERRED EMBODIMENTS

Figure 1:
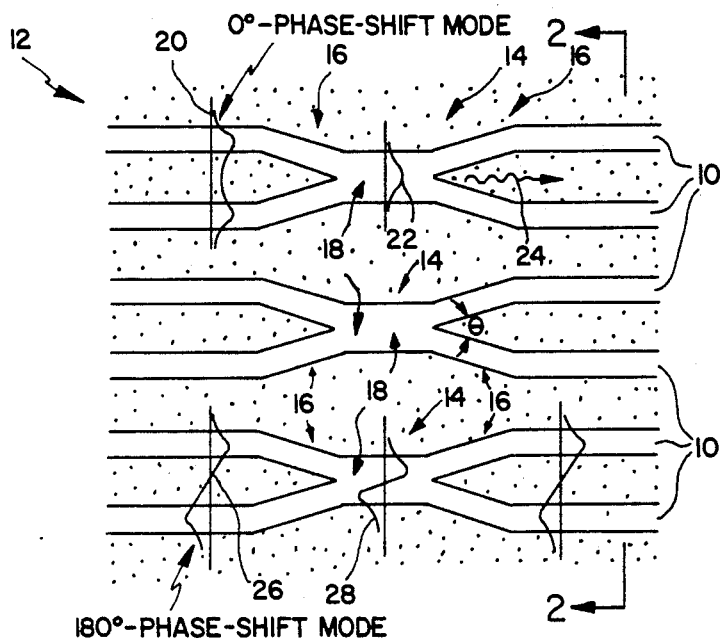
FIG. 1 is a fragmentary plan view of a semiconductor laser array configured in accordance with the present invention.

As shown in the drawings for purposes of illustration, the present invention is principally concerned with improvements in semiconductor diode laser arrays. There is a need in many applications to be able to drive semiconductor laser arrays at increasingly higher powers and drive currents. However, the far-field beamwidth increases at high drive currents, principally because of the effect of gain spatial hole burning. Ideally, it is desirable to avoid beam broadening very much beyond the diffraction limit. A diffraction-limited beam is one whose spatial spread is limited only by the diffraction of light, to a value roughly proportional to the wavelength of the emitted light divided by the width of the emitting source.

Although various configurations have been proposed to attain high output powers and diffraction-limited beams, they all have significant limitations, either in their operating characteristics or in the complexity and cost of their fabrication. Hence there has been a need for a semiconductor laser array of simple design that will operate at relatively high powers to produce a diffraction-limited beam.

In accordance with the present invention, a semiconductor laser array includes an X-junction configuration that discriminates strongly against the in-phase or 0°-phase-shift array mode of operation, resulting in operation in the 180°-phase-shift array mode. As shown in FIG. 1, the structure of the invention includes an array of semiconductor laser elements, indicated by reference numeral 10, six of which are shown in the figure. The laser elements 10 take the form of parallel waveguides, disposed in a composite semiconductor structure 12. A distinguishing aspect of the invention is that the waveguides 10 are coupled in adjacent pairs by coupling regions 14 referred to as X-junctions, located in a middle portion of the semiconductor structure 12. Each X-junction 14 may be considered to include two Y-junctions 16. That is to say, each pair of elements 10 converges into a single, wider interconnecting waveguide region 18, from which the two waveguides then diverge again back to their original spacing and width.

FIG. 1 also shows the effect of the X-junction structure on 0°-phase-shift array mode and 180°-phase-shift array mode oscillations in the structure. If, for example, an adjacent pair of waveguides supports fields that are in phase, as shown at 20, coupling of the waveguides to the connecting waveguide 18 results in a fundamental lateral mode, as shown at 22. However, because of the relatively large taper angle, $\theta$, selected for divergence of the waveguides, this mode suffers high scattering and radiation losses at the diverging Y-junction, as indicated at 24, providing a high level of discrimination against in-phase oscillation in adjacent waveguides. In contrast, if adjacent waveguides have fields that are out of phase, as indicated at 26, coupling to the interconnecting region 18 excites the first-order mode in this region, as indicated at 28. In this mode there is a central null at the midpoint between semiconductor laser elements 10. Therefore, little radiation or scattering loss is suffered at the second Y junction, and there is practically lossless coupling to the diverging waveguides in the out-of-phase mode.

Because of the presence of the X junctions, oscillation in the 0°-phase-shift array mode is discriminated against. Moreover, since the higher-order modes other than the 180°-phase-shift array mode have some in-phase components, the invention promotes operation solely in the 180°-phase-shift array mode. In a 10-element array with straight waveguides, some interelement losses and no X junctions, there would be a tendency to operate in the 180°-phase-shift array mode (mode L=10), but there would also be a mixture of other modes, particularly mode L=9. Since the L=9 mode adds in phase between elements five and six, this mode would be effectively suppressed by the X-junction array of the invention.

For operation to suppress in-phase operation of adjacent waveguides, the taper angle $\theta$ must be large enough to suppress the fundamental mode in the connecting waveguide 18, by scattering and radiation losses. This is contrary to the design of other devices using Y junctions, in which the taper angle is typically selected to be small enough to minimize losses in the region. In the illustrative embodiment of the invention, having a waveguide width of 3 $\mu$m and a differential refractive index $\Delta n_{eff}$ of approximately $7 \times 10^{-3}$, the taper angle of the junction should be greater than about 3°. For this specific device an angle of 6° was used.

The width of the wide connecting waveguide 18 should be sufficient to support the fundamental and first-order lateral modes. Although the limits of the width dimension have not been precisely established, it is believed that a width of 1.5 to 2 times the elemental waveguide width is optimal. In the illustrative embodiment, the elemental waveguides are of 3 $\mu$m width and the width of the interconnecting region 18 is approximately 5 $\mu$m. The length of the connecting waveguide 18 not critical, except that it should be long enough to permit the establishment of a fundamental or a first-order lateral mode in the region. Clearly, if the length were negligible, the modes in the individual waveguide elements would tend to propagate straight through the junction without substantial change. The minimum length needed to establish a lateral mode in the connecting guide is probably approximately 5 $\mu$m for the structure illustrated. In the presently preferred embodiment, a length of about 20 $\mu$m was used.

Figure 6:
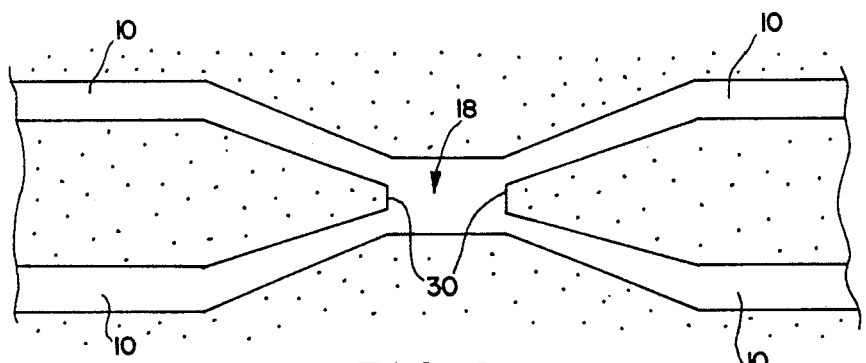
FIG. 6 is a fragmentary plan view of a single X-junction in accordance with an alternate embodiment of the invention.

A slight variant of the structure described above is shown in FIG. 6, and is intended for use with smaller values of the angle $\theta$, of approximately 3°. The alternate structure differs in that there is a flat region 30 instead of a sharp edge between adjacent diverging branches of the X junction.

Two alternate cross sections of the device are shown by way of example, one fabricated by liquid-phase epitaxial (LPE) growth and the other by a metal-organic chemical vapor deposition (MOCVD) process. In the LPE-grown cross section, shown in FIG. 2a, the device is grown on a substrate 40 of p+ gallium arsenide (GaAs), beginning with a buffer layer 42 of n type aluminum gallium arsenide ($Al_{.10}Ga_{.90}As$). Multiple channels 44 are formed in the layer 42 and extend partway into the substrate 40. Next, a first cladding layer 46 of p type aluminum gallium arsenide ($Al_{.30}Ga_{.70}As$), an active layer 48 of gallium arsenide (GaAs), and a second cladding layer 50 of n type aluminum gallium arsenide ($Al_{.30}Ga_{.70}As$), are formed over the substrate 40 and first layer 42. A cap layer 52 of n+ gallium arsenide covers the second cladding layer, followed by an oxide layer 54 and a metal layer 56 through which current is applied to the array, using a second metallized layer (not shown) beneath the substrate.

Figure 2A:
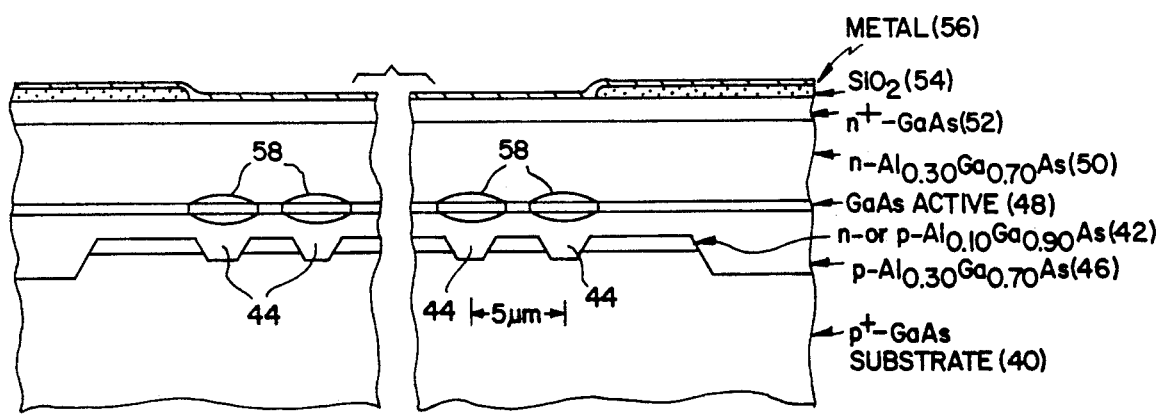
FIG. 2a is a typical fragmentary cross-sectional view taken in the direction 2—2 in FIG. 1, wherein the device is fabricated using liquid-phase epitaxial (LPE) growth.

In the embodiment illustrated in FIG. 2a, the channels have a center-to-center spacing of approximately 5 $\mu$m and a width of approximately 3 $\mu$m. The array elements 10 are evanescently coupled as well as coupled by the X junctions. The elongated oval shapes 58 represent regions in which lasing takes place above the multiple channels.

Figure 2B:
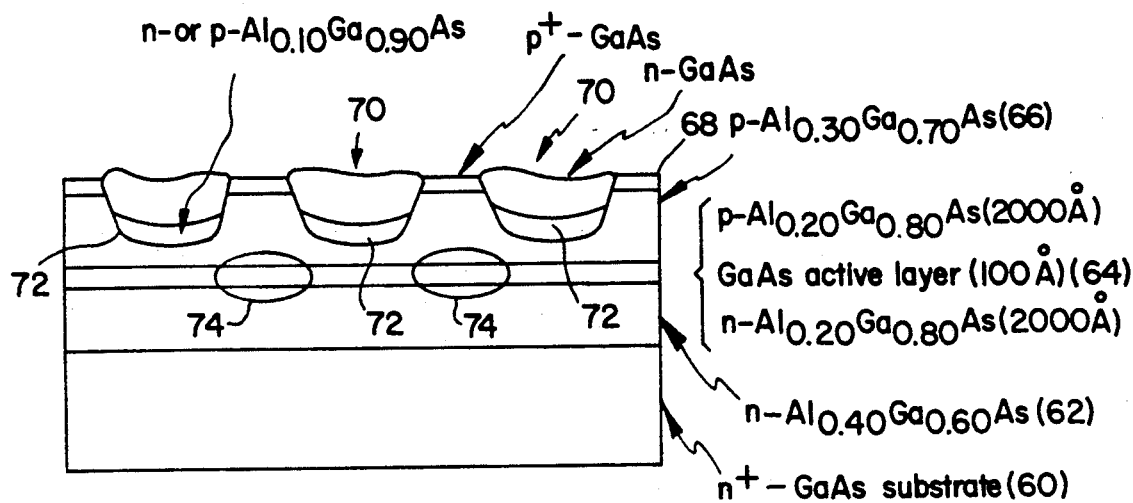
FIG. 2b is a typical fragmentary cross-sectional view taken in the direction 2—2 in FIG. 1, wherein the device is fabricated using a metal-organic chemical vapor deposition (MOCVD) process.

In the MOCVD-grown version of the device, as shown in FIG. 2b, includes an n+ type substrate 60 of gallium arsenide (GaAs), on which is formed an n type layer 62 of $Al_{0.4}Ga_{0.6}As$. An active layer 64 of undoped GaAs is next formed over the layer 62. The active layer, of thickness of about 100 Angstroms, is located between two additional layers of aluminum gallium arsenide ($Al_{0.2}Ga_{0.8}As$, not shown), each about 2,000 Angstroms thick, the lower one being of n type material and the upper one being of p type material. Above the active layer 64 is a layer 66 of $Al_{0.3}Ga_{0.7}As$ of p type material. A cap layer 68 of p+ type gallium arsenide is formed over the structure, and multiple channels 70 are formed to extend through the layers 68 and 66. The bottom of each channel 70 contains a buffer layer 72 that performs the same function as the buffer layer 42 in the embodiment shown in FIG. 1. The remainder of the channels are filled with n type aluminum gallium arsenide. The oval-shaped outlines 74 indicate the lasing regions of the device, which performs in basically the same manner as the FIG. 1 embodiment of the invention.

Figures 3A, 3B:
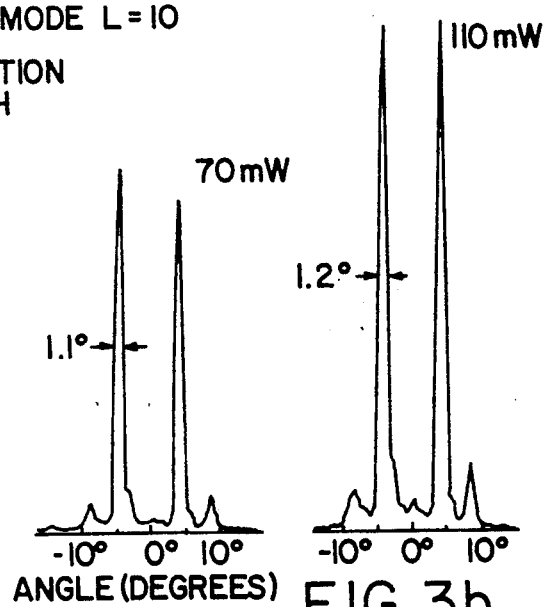
FIGS. 3a–3c are graphs of lateral far-field patterns produced by the structure of FIG. 2a operating at power levels of 70 mW, 110 mW and 230 mW, respectively, where the threshold current $I_{th}$ is 300 mA.
Figure 3C:
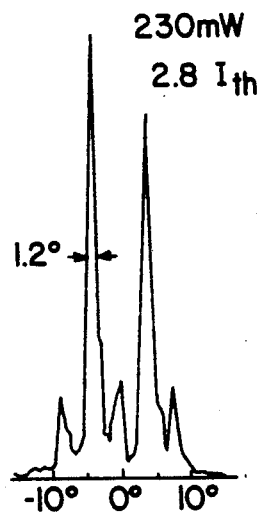
Figure 4:
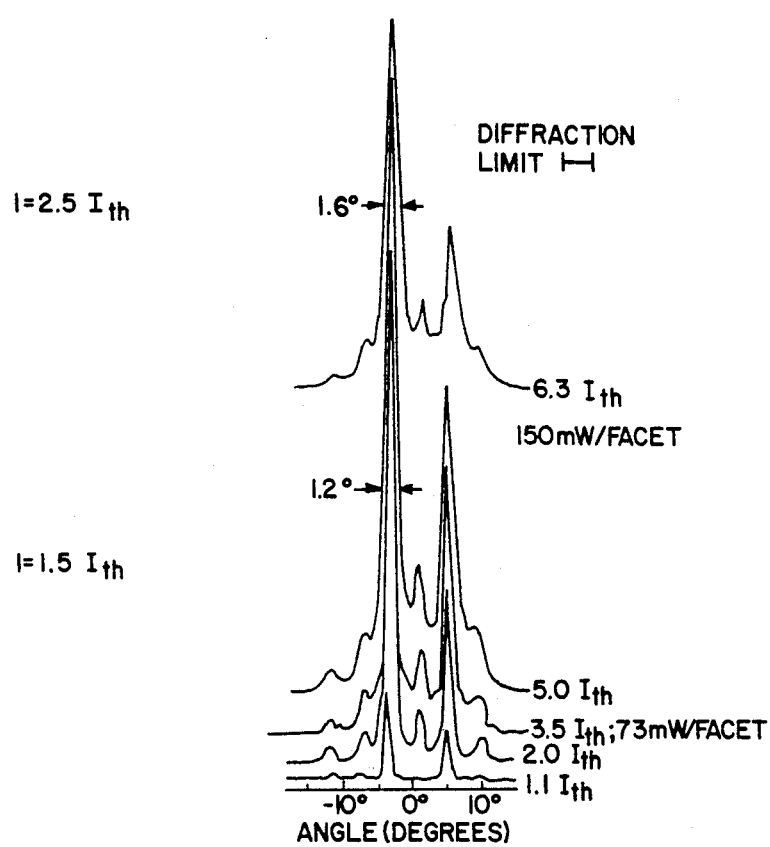
FIG. 4 are graphs of lateral far-field patterns produced by the structure of FIG. 2a at various drive current levels.

Lateral far-field patterns for the device of FIG. 2a are shown in FIGS. 3a–3c, for a threshold current of $I_{th}=300$ mA and with the devices having optimized facet coatings. FIG. 4 shows the far-field patterns for the same device as a function of drive current level, using uncoated facets. It will be observed that the far-field pattern has two lobes, and that the output beam is essentially diffraction limited for beam drive currents up to approximately three times the threshold current. The diffraction limit corresponds to a beam angle of approximately 1.1°.

Diffraction-limited beam patterns (1.2°) are maintained to about three times the threshold current and 230 mW total power (180 mW in mode L=10). This figure is believed to represent the highest reported power in a diffraction-limited beam pattern from index-guided arrays. Moreover, the X-junction array beam lobe widths remain under 1.5 times the diffraction limit up to 6.3 times the threshold current and 300 mW of power from two uncoated facets.

Figure 5A:
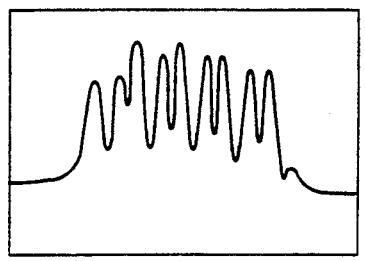
FIGS. 5a and 5b are graphs of near-field intensity patterns for the device of FIG. 2a, at drive levels of 2.5 $I_{th}$ and 1.5 $I_{th}$, respectively.
Figure 5B:
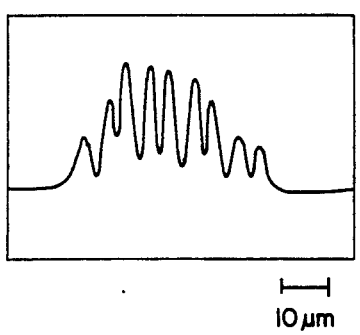

An analysis of near-field intensity is revealing as to what causes the excellent mode stability in the device with increasing drive level. As shown in FIG. 5b, near threshold the near-field profile for the device of FIG. 2a has a cosine-like envelope, as expected from theory. High above threshold, as shown in FIG. 5a, the profile becomes virtually uniform, due to mode defocusing and the presence of gain spatial hole burning. As the near field becomes more uniform, the gain spatial hole burning also becomes more uniform and thus a negative feedback mechanism is set up, which explains the inherent stability of high-order array modes with increasing drive level.

Typically, it will be desirable to provide a single-lobe diffraction-limited output beam, by means of 180° phase corrector plates, otherwise known as $\pi$ phase shifters, located at the output facet, adjacent to alternate elemental lasers. Various publications and patents have described how phase $\pi$ corrector plates are used in conjunction with semiconductor laser arrays; for example, U.S. Pat. No. 4,805,176 to Dan Botez et al., entitled "Phase-locked Laser Array with Phase-shifting Surface Coating." Another possible approach is to employ an external lens and zone plate to perform the phase shifting on alternate elemental outputs from the array, as described, for example, by J. R. Heidel et al. in a paper entitled "Use of a Phase Corrector Plate to Generate a Single-lobed Phased Array Far-field Pattern," IEEE J. of Quantum Electr., Vol. QE-22, pp. 749–53 (1986). The use of phase correction devices in conjunction with the structure of the invention results in a practically single-lobed far-field pattern that is diffraction-limited even for relatively high power levels.

It will be appreciated from the foregoing that the present invention represents a significant advance in the field of semiconductor laser arrays. In particular, the invention ensures stable, diffraction-limited operation at high drive levels and output powers, by means of an X-junction array that discriminates against in-phase operation of adjacent laser elements and thereby ensures stable operation in the 180°-phase-shift array mode. With the use of appropriate phase-shifting devices at or near the output facet of the array structure of the invention, the output beam is not only diffraction-limited at high output powers, but has a desirable single-lobed far-field pattern. It will also be appreciated that, although various embodiments of the invention have been described in detail for purposes of illustration, various modifications may be made without departing from the spirit and scope of the invention. Accordingly, the invention is not to be limited except as by the appended claims.

We claim:

1. A semiconductor laser array structure, comprising: means for producing lasing action in a semiconductor structure, including a substrate, an active semiconductor layer, electrodes for applying a voltage across the active layer, and a pair of reflective facets, at least one of which is an emitting facet, located at opposite ends of the array structure; and an array of waveguides with generally parallel longitudinal axes, the waveguides having a first set of parallel elements extending from one end of the structure to an intermediate region and a second set of parallel elements aligned with the first set and extending from the intermediate region to the other end of the structure, wherein each adjacent pair of the waveguides in the first set of parallel elements is coupled to an aligned pair of the waveguides in the second set of parallel elements, by an X-shaped junction located in the intermediate region and configured to provide significant losses for the 0°-phase-shift array mode and thereby discriminate against 0°-phase-shift array mode operation, whereby the laser array structure operates in the 180°-phase-shift array mode and produces a diffraction-limited beam at high output powers and drive currents substantially above threshold.

2. A semiconductor laser array structure as defined in claim 1, wherein each X-shaped junction includes:
    a pair of converging waveguide sections coupled one to each of a pair of the first set of parallel waveguide elements;
    a connecting waveguide into which the converging waveguide sections are coupled; and
    a pair of diverging waveguide sections coupled to the connecting waveguide and to an aligned pair of the second set of parallel waveguide elements;
    and wherein each pair of converging and diverging waveguide sections has its waveguide sections separated by a branching region, which is tapered at a divergence/convergence angle that is large enough to provide significant losses for the fundamental lateral mode of excitation of the connecting waveguide.

3. A semiconductor laser array structure as defined in claim 2, wherein:
    the divergence convergence angle is greater than approximately three degrees.

4. A semiconductor laser array structure as defined in claim 2, wherein:
    each branching region between a pair of converging or diverging waveguide sections presents a relatively flat surface toward the connecting waveguide, to provide higher losses for the fundamental lateral mode in the connecting waveguide.

5. A semiconductor laser array structure as defined in claim 2, wherein:
    the connecting waveguide is wide enough to support at least two lateral modes and is long enough to establish a single lateral mode.

6. A semiconductor laser array structure as defined in claim 5, wherein:
    the connecting waveguide is approximately one and one-half to two times the width of each waveguide element.

7. A semiconductor laser array structure as defined in claim 5, wherein:
    the connecting waveguide is at least approximately five micrometers long.

8. A semiconductor laser array structure as defined in claim 7, and further comprising:
    selective phase-shifting means to correct the phase of selected elemental outputs.

9. A semiconductor laser array structure as defined in claim 2, wherein:

the structure is formed by a liquid-phase epitaxy (LPE) process.

10. A semiconductor laser array structure as defined in claim 2, wherein:
the structure is formed by a metal-organic chemical vapor deposition (MOCVD) process.

11. A semiconductor laser array structure, comprising:
means for producing lasing action in a semiconductor structure, including a substrate, an active semiconductor layer, electrodes for applying a voltage across the active layer, and a pair of reflective facets, at least one of which is an emitting facet, located at opposite ends of the array structure; and
a plurality N of X-shaped waveguide regions located in a middle region of the structure, each X-shaped waveguide region having a pair of converging waveguide sections, a pair of diverging waveguide sections, and a connecting waveguide into which the converging waveguide sections converge and from which the diverging waveguide sections diverge;
a plurality of 2N of spaced-apart parallel waveguide elements, each adjacent pair of waveguide elements extending from one end of the structure and being coupled to the converging waveguide sections of an X-shaped waveguide region;
a second plurality of 2N of spaced-apart parallel waveguide elements, each adjacent pair of these waveguide elements extending from the other end of the array structure and being coupled to the diverging waveguide sections of the X-shaped waveguide section;
wherein the X-shaped waveguide sections are configured to to provide significant losses for the 0°-phase-shift array mode and thereby to discriminate against 0°-phase shift array mode operation, whereby the laser array structure operates in the 180°-phase-shift array mode and produces a diffraction-limited beam at high output powers and drives currents substantially above threshold.

12. A semiconductor laser array structure as defined in claim 11, wherein:
each pair of converging and diverging waveguide sections has its waveguide sections separated by a branching region, which is tapered at a divergence/convergence angle that is large enough to provide significant losses for the fundamental lateral mode of excitation of the connecting waveguide.

13. A semiconductor laser array structure as defined in claim 12, wherein:
the divergence/convergence angle is greater than approximately three degrees.

14. A semiconductor laser array structure as defined in claim 12, wherein:
each branching region between a pair of converging or diverging waveguide sections presents a relatively flat surface toward the connecting waveguide, to provide higher losses for the fundamental lateral mode in the interconnecting region.

15. A semiconductor laser array structure as defined in claim 12, wherein:
the connecting waveguide is wide enough to support at least two lateral modes and is long enough to establish a single lateral mode.

16. A semiconductor laser array structure as defined in claim 12, wherein:
the connecting waveguide is approximately one and one-half to two times the width of each waveguide element.

17. A semiconductor laser array structure as defined in claim 16, wherein:
the connecting waveguide is at least approximately five micrometers long.

18. A semiconductor laser array structure as defined in claim 12 and further comprising:
selective phase-shifting means positioned to correct the phase of selected elemental outputs.

19. A semiconductor laser array structure as defined in claim 12, wherein:
the structure is formed by a liquid-phase epitaxy (LPE) process.

20. A semiconductor laser array structure as defined in claim 12, wherein:
the structure is formed by a metal-organic chemical vapor deposition (MOCVD) process.

* * * * *